(12) United States Patent
Kaeriyama (10) Patent No.: US 11,949,412 B2
(45) Date of Patent: Apr. 2, 2024

(54) SEMICONDUCTOR DEVICE AND CONTROL SYSTEM

(71) Applicant: RENESAS ELECTRONICS CORPORATION, Tokyo (JP)

(72) Inventor: Shunichi Kaeriyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/965,335

(22) Filed: Oct. 13, 2022

(65) Prior Publication Data

US 2023/0170898 A1 Jun. 1, 2023

(30) Foreign Application Priority Data

Dec. 1, 2021 (JP) ................. 2021-195466

(51) Int. Cl.
| | |
|---|---|
| *H02M 1/08* | (2006.01) |
| *H02M 1/38* | (2007.01) |
| *H03K 7/08* | (2006.01) |
| *H03K 17/687* | (2006.01) |
| *H02P 27/08* | (2006.01) |

(52) U.S. Cl.
CPC .......... *H03K 17/6871* (2013.01); *H02M 1/08* (2013.01); *H02M 1/38* (2013.01); *H03K 7/08* (2013.01); *H02P 27/08* (2013.01); *H03K 2217/0063* (2013.01); *H03K 2217/0072* (2013.01); *H03K 2217/0081* (2013.01)

(58) Field of Classification Search
CPC ........... H02M 1/08; H02M 1/38; H02P 27/08; H03K 7/08; H03K 17/6871; H03K 2217/0063; H03K 2217/0072; H03K 2217/0081

USPC .......................... 307/104; 327/108, 109, 110
See application file for complete search history.

(56) References Cited

U.S. PATENT DOCUMENTS

| | | | |
|---|---|---|---|
| 6,225,927 B1* | 5/2001 | Scott | H04L 25/0266 341/110 |
| 8,618,630 B2 | 12/2013 | Kaeriyama | |
| 10,277,278 B2* | 4/2019 | Goswami | H04L 47/825 |
| 2008/0198904 A1* | 8/2008 | Chang | H01F 19/08 375/E1.002 |
| 2013/0264961 A1* | 10/2013 | Chang | H04B 10/802 315/201 |
| 2014/0307759 A1* | 10/2014 | Sundar | H04B 1/40 375/219 |
| 2014/0328427 A1* | 11/2014 | Chang | H05B 45/10 375/259 |
| 2019/0207742 A1* | 7/2019 | Haroun | H02P 6/00 |

FOREIGN PATENT DOCUMENTS

| | | | |
|---|---|---|---|
| JP | 5375952 B2 | 12/2013 | |
| JP | 5504903 B2 | 5/2014 | |

* cited by examiner

*Primary Examiner* — William Hernandez
(74) *Attorney, Agent, or Firm* — Rimon, P.C.

(57) ABSTRACT

A semiconductor device includes a galvanic isolator; a transmitting circuit that transmits a transmission signal via the galvanic isolator; a receiving circuit that receives a received signal corresponding to the transmission signal via the galvanic isolator; an encoding circuit that encodes two input signals and generates the transmission signal; and a decoding circuit that decodes the two input signals from the received signals.

14 Claims, 11 Drawing Sheets

SEMICONDUCTOR DEVICE AND CONTROL SYSTEM

CROSS-REFERENCE TO RELATED APPLICATIONS

The disclosure of Japanese Patent Application No. 2021-195466 filed on Dec. 1, 2021, including the specification, drawings and abstract is incorporated herein by reference in its entirety.

BACKGROUND

The present invention relates to a semiconductor device and a control system using a galvanic isolator.

THE BACKGROUND OF THE INVENTION

Power transistors (power MOSFET and IGBT) are used in high-voltage devices, such as motors, power converters, and illuminators. On the other hand, an MCU (Micro Controller Unit) that controls the power transistors operates at low voltages. A galvanic isolator (hereinafter referred to as an isolator) such as a capacitor or a transformer is used for such communication between the power transistor and the MCU.

In recent years, with the popularization of electric vehicles (EVs) and hybrid electric vehicles (HEVs), miniaturization of systems using isolators has been demanded.

Patent document 1 discloses a technique related to an on-chip transformer in which a transformer is formed on a semiconductor chip.

Patent document 2 describes a technique for miniaturization an on-chip transformer and an on-chip capacitor. [Prior-art document]

PATENT DOCUMENT

[Patent Document 1] Japanese Patent No. 5504903
[Patent Document 2] Japanese Patent No. 5375952

SUMMARY

PWM (Pulse Width Modulation) control is widely used for controlling loads (control of rotational speed and brightness) of a motor, an illumination device, and the like. For example, when a three-phase (U, V, W phase) motor is controlled by PWM, six (U, V, W, U-bar, V-bar, W-bar) power transistors are required (see FIGS. 21 and 22 of Patent Document 2). In this case, six isolators are also required. One transformer occupies a chip area of 300-400 µm in diameter (or twice that). Moreover, no other circuit can be arranged at several 100 µm around the transformer. As the number of isolators increases, it becomes difficult to reduce the size of a semiconductor chip on which the isolators are mounted.

Patent document 2 discloses a technique of reducing the number of isolators by MUX and DEMUX low-side (U-bar, V-bar, W-bar) signals (FIG. 25 of Patent Literature 2). However, since signals of a plurality of bits are transmitted and received together, a communication delay is caused. In addition, it is difficult to deal with a case where an input signal changes during transmission and reception of a signal of a plurality of bits. Therefore, the technique disclosed in Patent document 2 is difficult to be applied to control necessary real-time performance.

A semiconductor device includes a galvanic isolator; a transmitting circuit that transmits a transmission signal via the galvanic isolator; a receiving circuit that receives a received signal corresponding to the transmission signal via the galvanic isolator; an encoding circuit that encodes two input signals and generates the transmission signal; and a decoding circuit that decodes the two input signals from the received signals.

According to the embodiment, the area of the circuit for driving the power transistor can be greatly reduced, and the wire bonding can be reduced.

DETAILED DESCRIPTION

Hereinafter, Semiconductor device and control system according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

Figure 1:
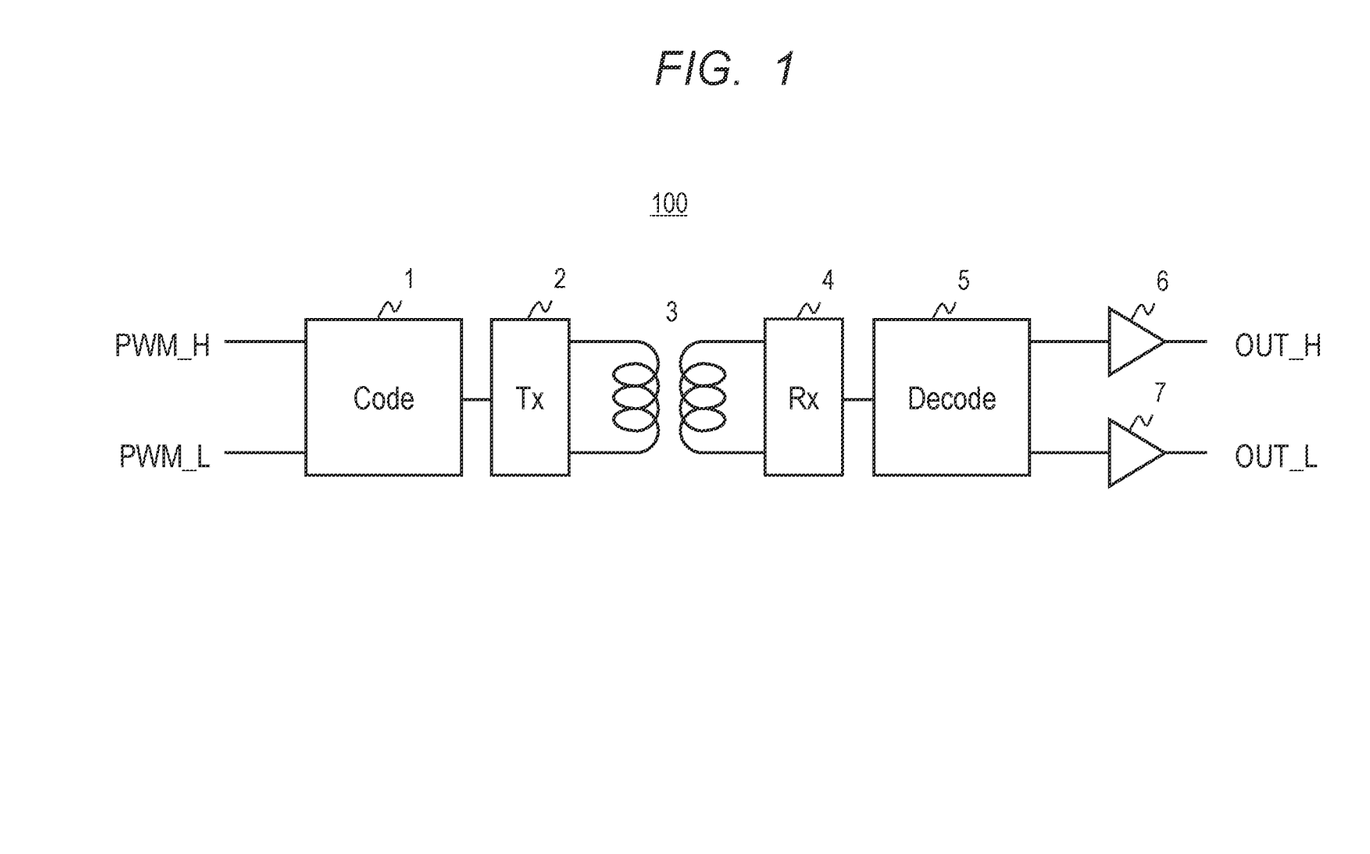
FIG. 1 is a block diagram of a semiconductor device according to a first embodiment.

FIG. 1 is a block diagram of a semiconductor device 100 according to the first embodiment. The semiconductor device 100 is a device for controlling a high-side switch (power transistor) and a low-side switch (power transistor) for driving a load such as a motor by PWM. As illustrated in FIG. 1, the device 100 includes an encoding circuit (Code) 1, a transmitting circuit (Tx) 2, an isolator 3, a receiving circuit (Rx) 4, a decoding circuit (Decode) 5, and driver circuits 6 and 7.

The encoding circuit 1 is a circuit that generates one output signal by encoding a PWM_H signal for driving a high-side switch and a PWM_L signal for driving a low-side switch, which are generated by an external MCU or the like.

The transmitting circuit 2 is a circuit that transmits an output signal of the encoding circuit 1 to the isolator 3. The receiving circuit 4 is a circuit that outputs a signal received by the isolator 3 to the decoding circuit 5. Since the transmitting circuit 2, the isolator 3, and the receiving circuit 4 are the same as those in the related art (for example, Patent Documents 1 and 2), detailed description thereof will be omitted.

The isolator 3 is a galvanic isolator formed of a capacitor, a transformer, or the like.

The decoding circuit 5 is a circuit that generates two output signals (PWM_H and PWM_L) by decoding the encoded signal received via the isolator 3 and the receiving circuit 4.

The driver circuits 6 and 7 generate signals OUT_H and OUT_L for driving the high-side switch and the low-side switch based on the signals decoded by the decoding circuit 5.

Figure 2:
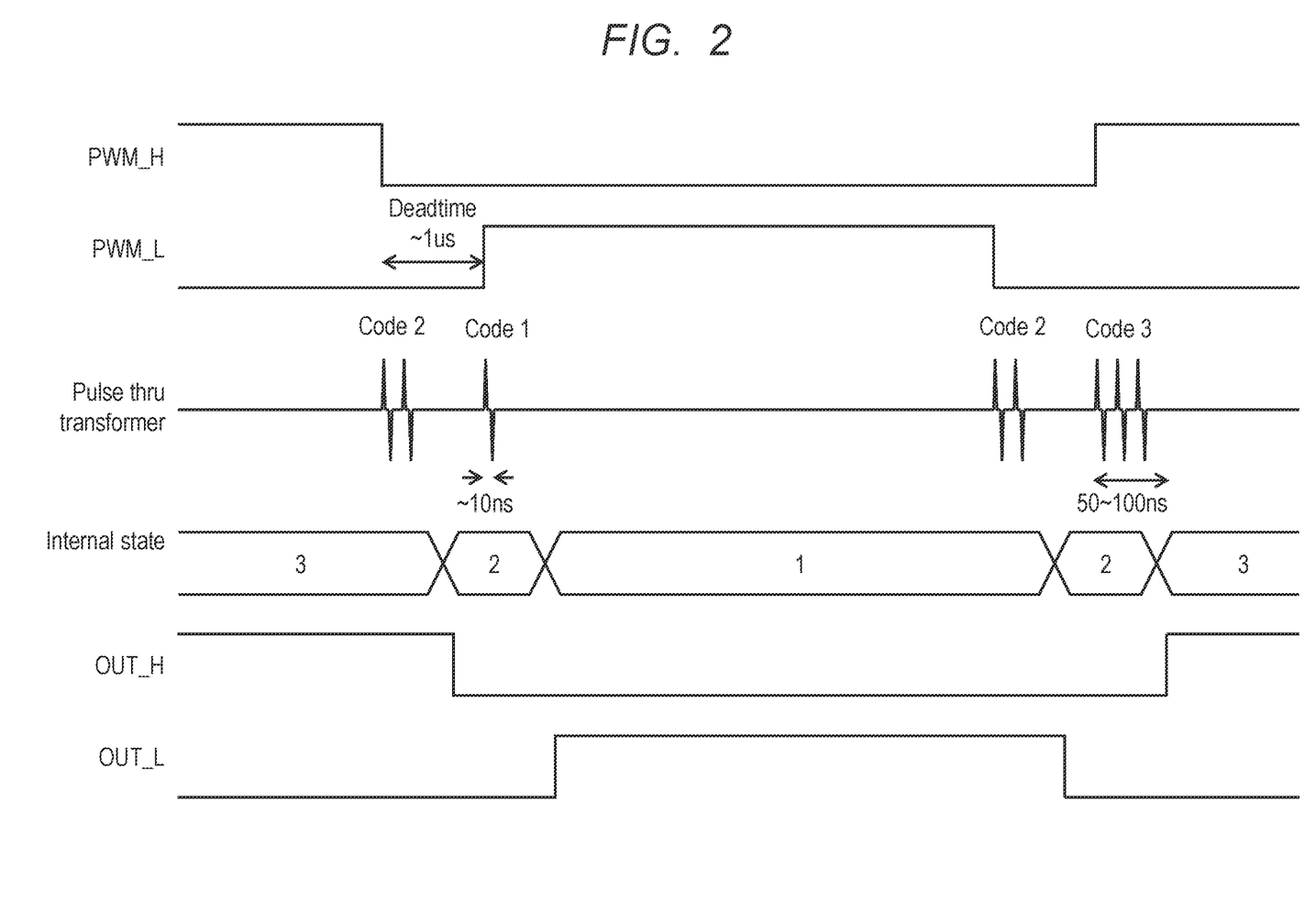
FIG. 2 is a timing chart for explaining the operation of the semiconductor device according to the first embodiment.

Next, the operations of the encoding circuit 1 and the decoding circuit 5 will be described in detail. FIG. 2 is a timing chart for explaining operations of the encoding circuit 1 and the decoding circuit 5.

In FIG. 2, the PWM_H signal is changed to ON (Hi), OFF (Lo), and ON. Further, the PWM_L signal is changed to off, on, and off. In the PWM control, a dead time is provided and the PWM_H and the PWM_L are not turned on at the same time. The dead time is provided between the point of change from on to off of the PWM_H signal and the point of change from off to on of the PWM_L signal. Similarly, a dead time is provided between the point of change of the PWM_L signal from ON to OFF and the point of change of the PWM_H signal from OFF to ON. Therefore, the signal input to the encoding circuit 1 becomes (PWM_H, PWM_L)=(L, H), (L, L), (H, L). Here, (PWM_H, PWM_L)=(L, H) is defined as state 1, (PWM_H, PWM_L)=(L, L) is defined as state 2, and (PWM_H, PWM_L)=(H, L) is defined as state 3.

In the first embodiment, the encoding circuit 1 detects the state of the input signal and expresses the detected state by the number of pulses within a predetermined period. Specifically, as shown in FIG. 2, the state 1 is represented by one pulse, the state 2 is represented by two pulses, and the state 3 is represented by three pulses.

Each pulse signal generated by the encoding circuit 1 is input to the decoding circuit 5 via the transmitting circuit 2, the isolator 3, and the receiving circuit 4.

The decoding circuit 5 decodes the original PWM_H and PWM_L signals based on the input pulse signals. The decoding operation is opposite to the encoding operation. That is, the decoding circuit 5 detects the state from the number of pulses of the input signal, and generates an output signal corresponding to the detected state. Specifically, as shown in FIG. 2, when the number of pulses is 1, a signal is generated in which (PWM_H, PWM_L)=(L, H) is in the state 1. If the number of pulses is 2, the state is 2, and a signal (PWM_H, PWM_L)=(L, L) is generated. If the number of pulses is 3, the state is 3, and a signal (PWM_H, PWM_L)=(H, L) is generated.

Figure 3:
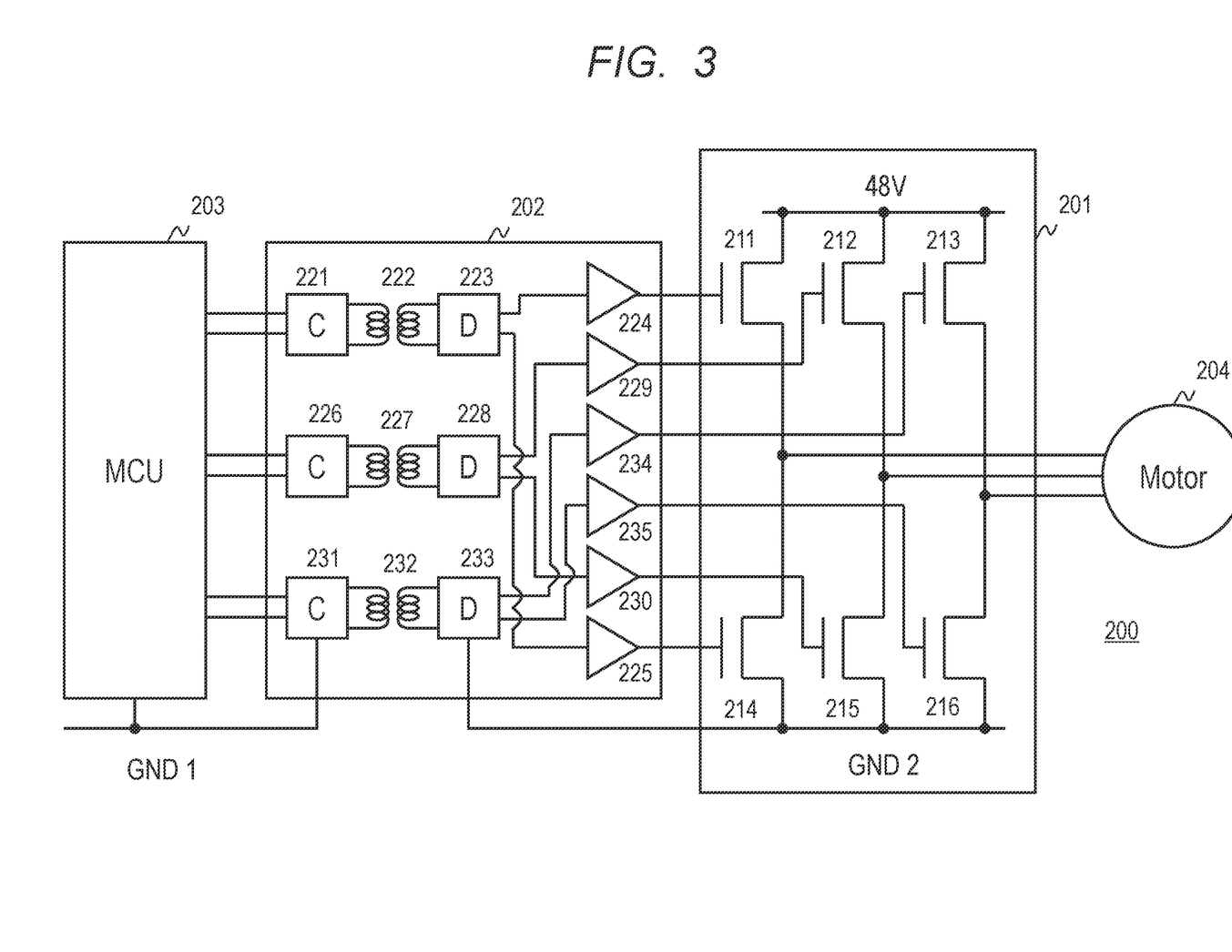
FIG. 3 is a block diagram of a three-phase motor control system according to the first embodiment.

FIG. 3 is a diagram in which the semiconductor device 100 is applied to the three-phase motor control system 200. As shown in FIG. 3, the three-phase motor control system 200 includes an inverter 201, an insulated gate driver 202, a Micro Control Unit (MCU) 203, and a three-phase motor 204.

The inverter 201 includes high-side switches (power transistors) 211 to 213 and low-side switches (power transistors) 214 to 216 for driving the three-phase motor 204. The high-side switches 211, 212, and 213 are U-phase, V-phase, and W-phase switches, respectively. The low-side switches 214, 215, and 216 are U_bar phase, V_bar phase, and W_bar phase switches, respectively.

Three sets of the semiconductor devices 100 illustrated in FIG. 1 are mounted on the insulated gate driver 202. That is, the encoding circuit 221, the isolator 222, the decoding circuit 223, and the driver circuits 224 and 225 are gate drivers for the U/U_bar phase. The encoding circuit 226, the isolator 227, the decoding circuit 228, and the driver circuits 229 and 230 are gate drivers for the V/V_bar phase. The encoding circuit 231, the isolator 232, the decoding circuit 233, and the driver circuits 234 and 235 are gate drivers for the W/W_bar phase. Note that in FIG. 3, the transmitting circuit and the receiving circuit of the semiconductor device 100 are omitted as being built in the encoding circuit and the decoding circuit, respectively.

Here, the insulated gate driver 202 is composed of one semiconductor package on which the first and second semiconductor chips are mounted. Encoding circuits 221, 226, 231, isolators 222, 227, and 232 are mounted on the first semiconductor chip, and decoding circuits 223, 228, and 233, driver circuits 224, 225, 229, 230, 234, and 235 are mounted on the second semiconductor chip. Alternatively, the encoding circuits 221, 226, and 231 may be mounted on the first semiconductor chip, and the isolators 222, 227, and 232, the decoding circuits 223, 228, and 233, and the driver circuits 224, 225, 229, 230, 234, and 235 may be mounted on the second semiconductor chip. Alternatively, the insulated gate driver 202 may be composed of one semiconductor package on which the first to third semiconductor chips are mounted. At this time, the encoding circuits 221, 226, and 231 are mounted on the first semiconductor chip, the isolators 222, 227, and 232 are mounted on the second semiconductor chip, and the decoding circuits 223, 228, and 233, the driver circuits 224, 225, 229, 230, 234, and 235 are mounted on the third semiconductor chip.

MCU 203 generates a three-phase PWM signal so that the three-phase motor 204 is in the desired operation and provides it to an insulated gate driver. In practice, MCU 203 generates PWM-signals while sensing the rotational angle and current of the three-phase motor 204 with a sensor. A method of generating a PWM signal is a general technique, and therefore a description thereof will be omitted.

As can be seen from FIG. 3, according to the first embodiment, three sets of transmitting circuit, isolator, and receiving circuit are required. In contrary, according to the conventional method, six sets thereof are required.

As described above, in the semiconductor device 100 according to the first embodiment, an encoding circuit that performs encoding according to the states of the PWM_H and PWM_L signals and a decoding circuit that performs decoding of the encoded signal are provided. As a result, the area of the circuit for driving the power transistor can be greatly reduced, and the wire bonding can be reduced.

Note that the present disclosure is not limited to the above-described embodiments. For example, the above-described states 1 to 3 may be encoded not by the number of pulses within a predetermined period, but by the frequency of the pulses, the amplitude of the pulses, the combination of different pulses, and the like.

Modification

Figure 4:
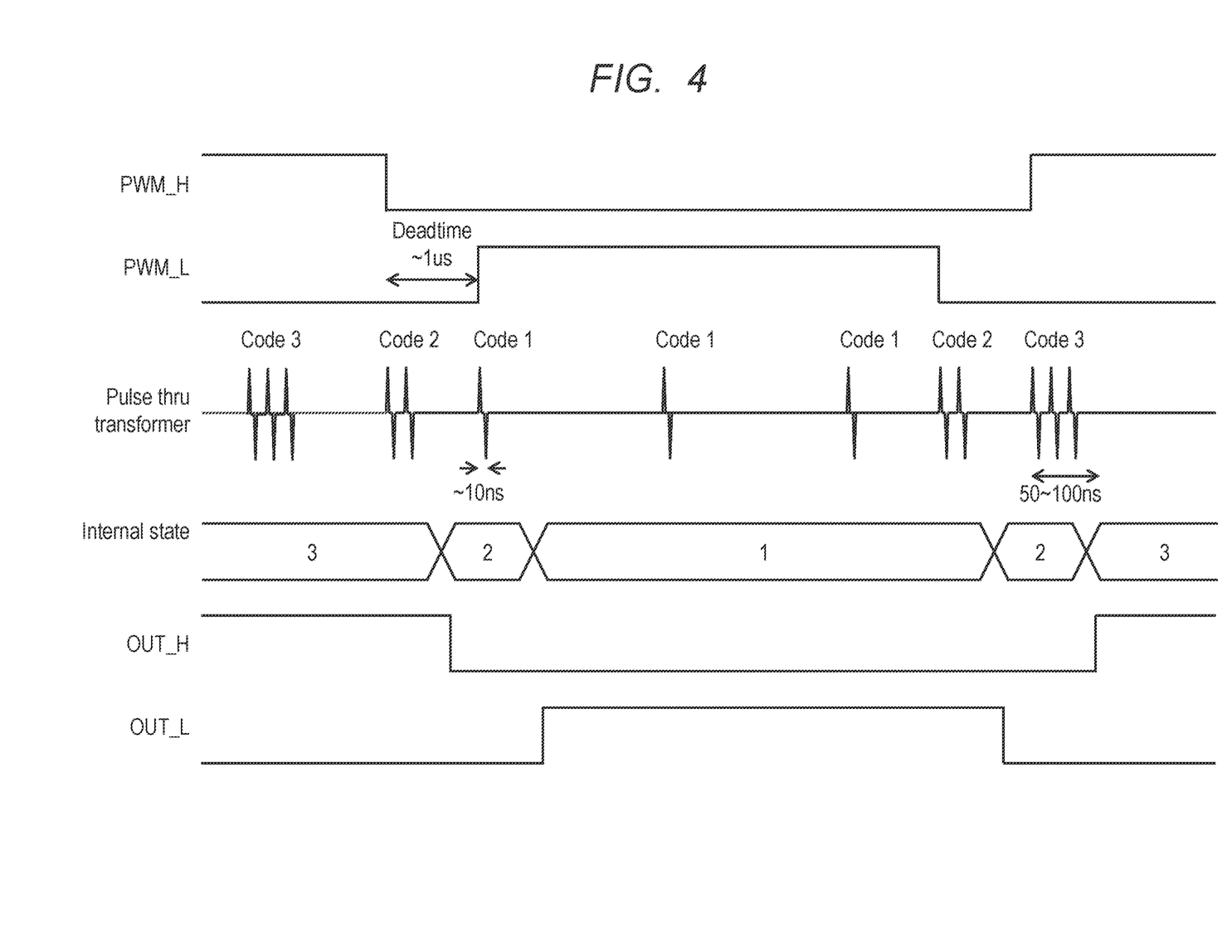
FIG. 4 is a flowchart for explaining an operation of the semiconductor device according to the modification of the first embodiment.

FIG. 4 is a modification of the first embodiment. In the first embodiment, the encoding circuit 1 generates a pulse signal in accordance with a change in the state of the input signals. In the present modification, the encoding circuit 1 generates a pulse signal indicating the state even when there is no change in the state of the input signals. In FIG. 4, a pulse indicating state 1 is generated in the middle of state 1

((PWM_H, PWM_L)=(L, H)). That is, in the present modification, a signal of one pulse is generated three times at the time of change to the state 1, in the middle of the state 1, and at the time of change from the state 1. Note that the second pulse may be generated after a predetermined time has elapsed from the first pulse generation.

In this modification, even when there is no change in the state of the input signals, a pulse signal indicating the state is generated. Thus, it is possible to suppress the occurrence of a state shift between the transmitting side (the encoding circuit side) and the receiving side (the decoding circuit side).

Second Embodiment

Figure 5:
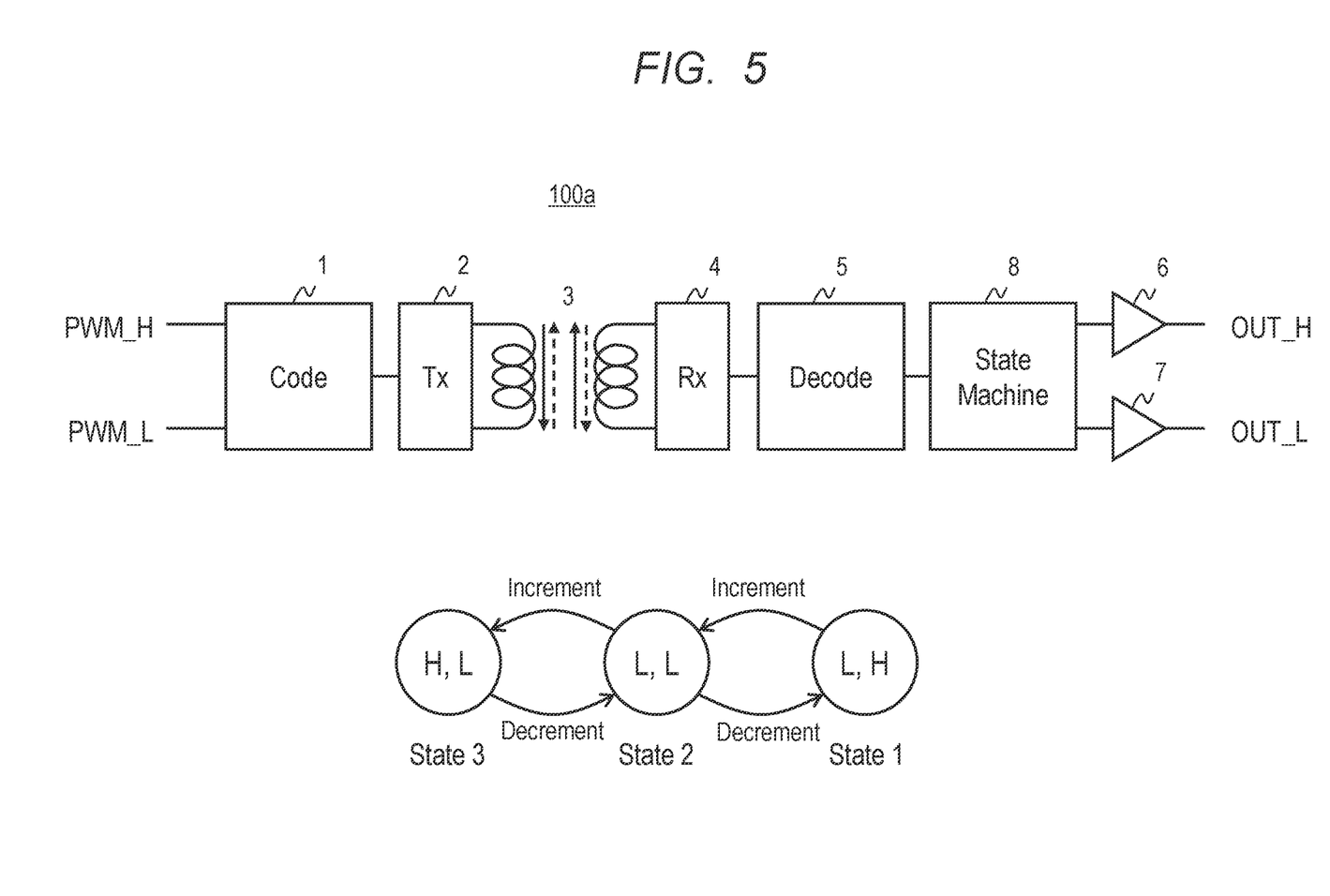
FIG. 5 is a block diagram of a semiconductor device according to a second embodiment.

FIG. 5 is a block diagram of a semiconductor device 100a according to the second embodiment. The difference from the first embodiment is that a state machine 8 is added. In the second embodiment, the operations of the encoding circuit 1 and the decoding circuit 5 are different from those of the first embodiment.

As described in the first embodiment, the PWM_H and L signals used in the motor control, the inverter, and the power supply circuit are provided with dead times, and the transitions in the PWM_H and L signals are limited to the state transitions shown in the following figure of FIG. 5. In the second embodiment, this state transition is expressed by increment and decrement. That is, the transition from state 1 to state 2 and the transition from state 2 to state 3 are expressed by "increment", and the transition from state 3 to state 2 and the transition from state 2 to state 1 are expressed by "decrement". The encoding circuit 1 generates a signal corresponding to the increment of PWM_H and PWM_L and a signal corresponding to the decrement.

Figure 6:
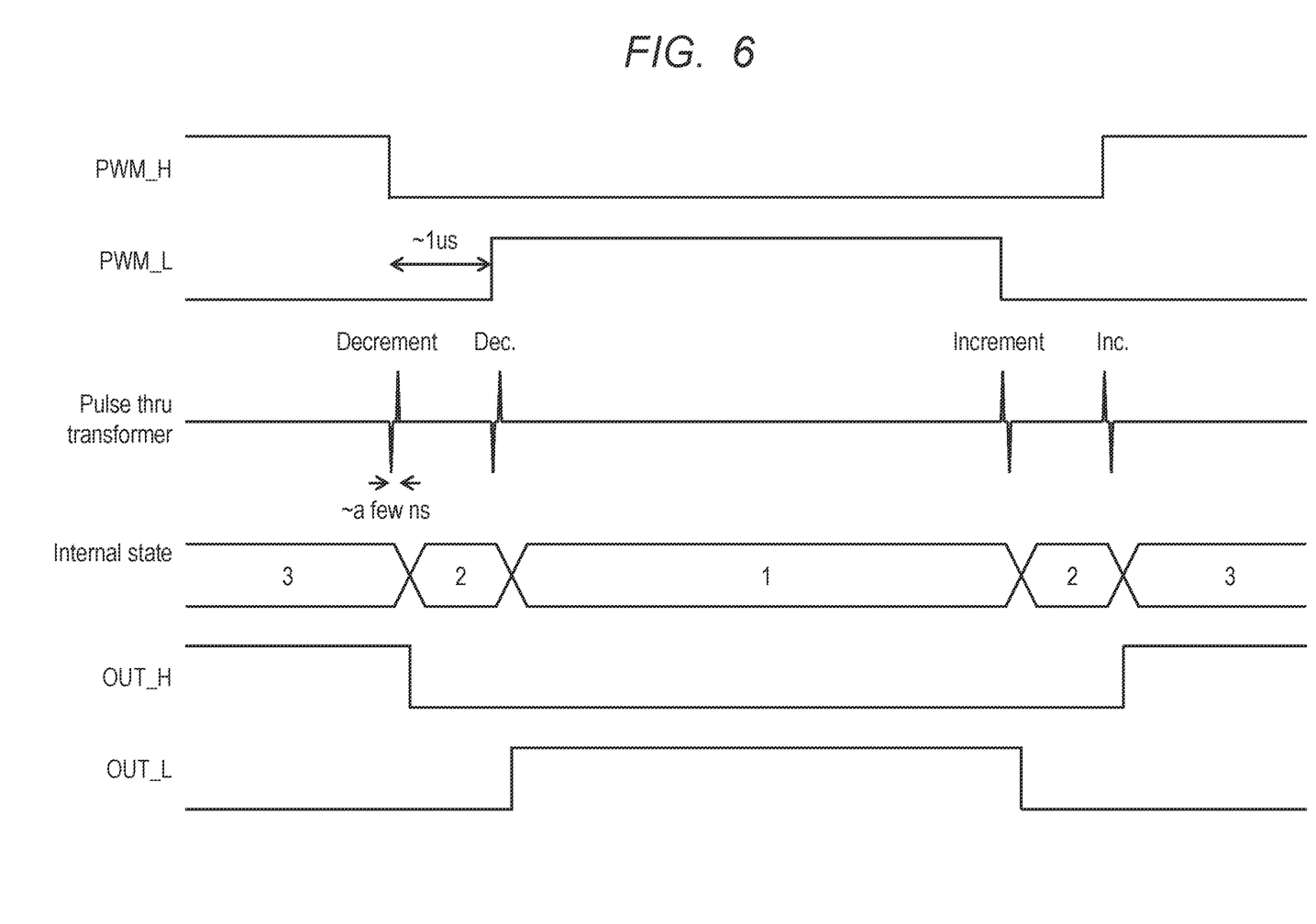
FIG. 6 is a flowchart for explaining an operation of the semiconductor device according to the second embodiment.

FIG. 6 is a timing chart for explaining operations of the encoding circuit 1, the decoding circuit 5, and the state machine 8. In the second embodiment, the encoding circuit 1 expresses increment and decrement according to the direction of the current pulse flowing through the transformer (isolator 3). The voltage appearing in the receiver coil of the transformer is proportional to di/dt of current flowing in the transmitter coil. Further, the direction of the pulse appearing in the reception side coil is determined by the direction of the current when the current flowing in the transmission side coil is raised. Further, when the current flowing through the transmission-side coil falls to 0, a pulse in the opposite direction appears in the reception-side coil. The encoding circuit 1 uses these phenomena to express increment and decrement. That is, in the increment, as shown in FIG. 5, after the current flows in the direction of the arrow of the solid line to the transmission side coil, the current is set to 0. A pulse with a positive potential difference appears in the direction of the solid arrow in the receiving coil, and a pulse in the opposite direction appears. In the decrement, after the current flows in the direction of the dashed arrow in the transmission side coil, the current is set to 0. A pulse with a positive potential difference appears in the direction of the dashed arrow in the receiving coil, and a pulse in the opposite direction appears. In FIG. 6, a pulse having a positive potential difference in the direction of the solid-line arrow is represented as a positive pulse in the receiving-side coil, and a pulse having a positive potential difference in the direction of the dashed-line arrow is represented as a negative pulse.

The decoding circuit 5 decodes the increment/decrement based on the input pulse signal. The statement machine 8 restores the original PWM_H and PWM_L signals based on the increment/decrement (the operation shown in the figure below in FIG. 5 is performed). In the state machine 8, the initial state (any one of the states 1 to 3) is determined in advance, or the state needs to be notified from the transmitting side.

When the second embodiment is applied to a three-phase motor control system or the like, the area of the circuit can be greatly reduced as in the first embodiment. Further, since the signal to be encoded/decoded is a short signal (a signal having a small number of pulses), it is possible to reduce the latency and power required for transmission and reception of the signal.

Third Embodiment

The semiconductor device according to the third embodiment is similar to the second embodiment. In the third embodiment, the operations of the encoding circuit 1 and the decoding circuit 5 are different from those in the second embodiment.

As described above, in the second embodiment, it is necessary to determine in advance the initial state (any one of states 1 to 3) of the state machine 8 or to notify the state of the transmitting side. Therefore, in the third embodiment, a function of notifying the state itself is added.

Figure 7:
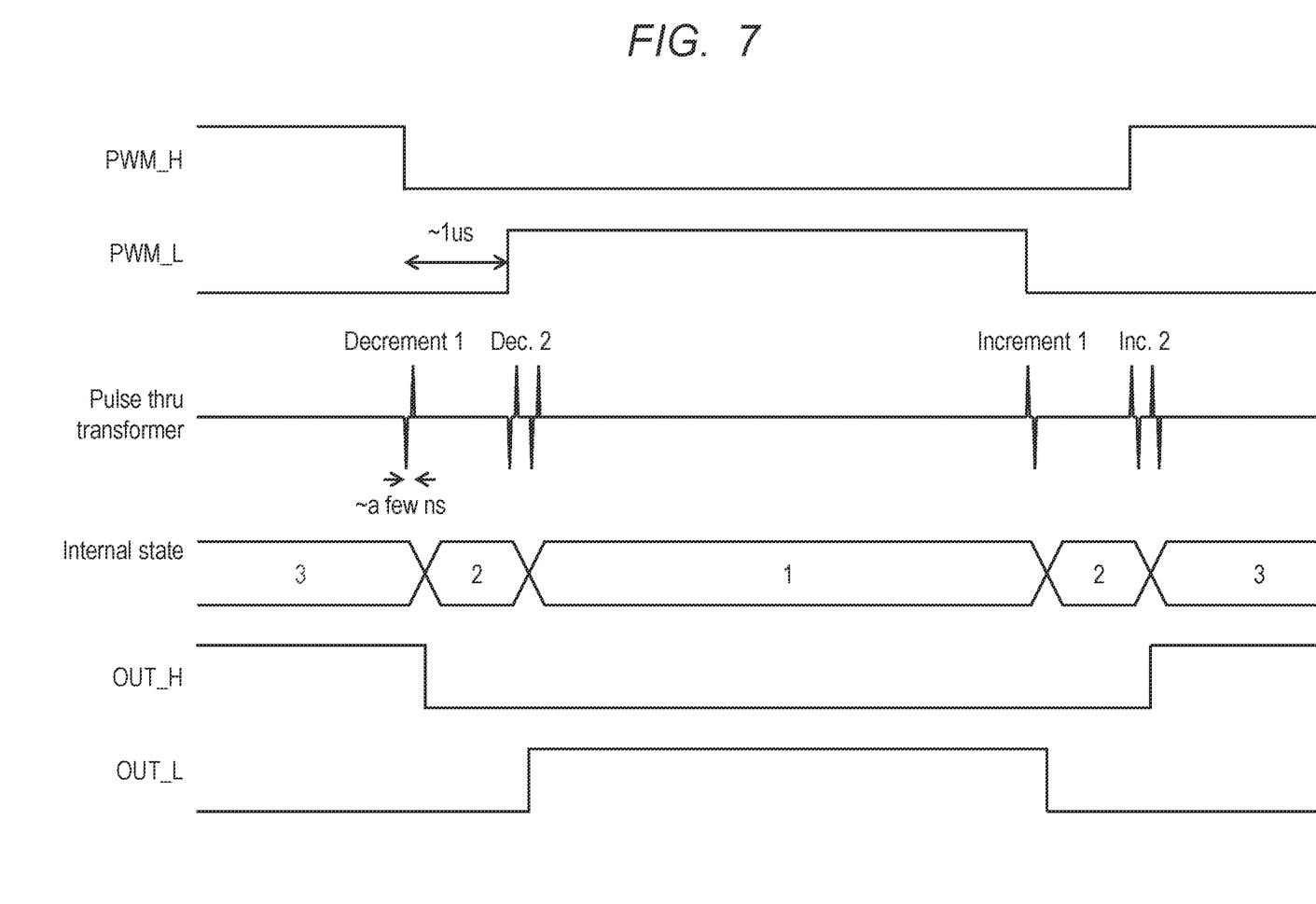
FIG. 7 is a flowchart for describing an operation of the semiconductor device according to a third embodiment.

FIG. 7 is a timing chart for explaining operations of the encoding circuit 1 and the decoding circuit 5. As in the second embodiment, the encoding circuit 1 generates a signal corresponding to the increment of PWM_H and PWM_L and a signal corresponding to the decrement. However, the encoding circuit 1 duplexes the pulses at the time of transition to the state 1 or the state 3. That is, as shown in FIG. 7, in the transition from state 3 to state 2, a pulse indicating the same decrement as in the second embodiment (one pulse on the negative side and one pulse on the positive side) is generated, and in the transition from state 1 to state 2, a pulse indicating the same increment as in the second embodiment (one pulse on the positive side and one pulse on the negative side) is generated. Then, in the transition from state 2 to state 1, two pulses indicating decrement are generated, and in the transition from state 2 to state 3, two pulses indicating increment are generated. As a result, it is possible to determine which state the transmission side is in, and it is possible to suppress the mismatch between the states of the transmitting side and the receiving side.

Figure 8:
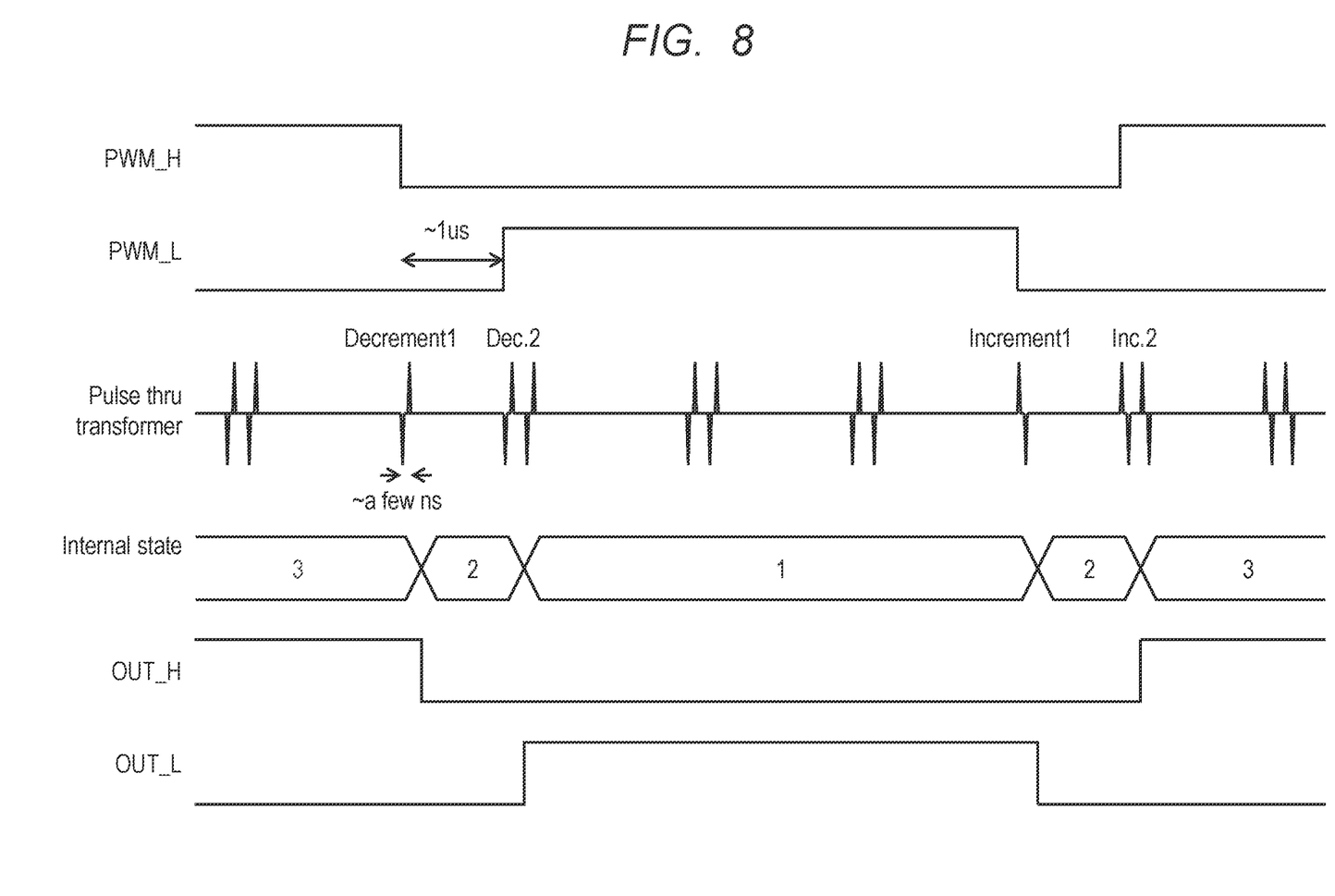
FIG. 8 is a flowchart for explaining an operation of the semiconductor device according to the third embodiment.

In order to more accurately synchronize the states of the transmitting side and the receiving side, pulses indicating increment/decrement may be periodically transmitted during a period in which there is no state transition. FIG. 8 shows that the above-described duplicated increment/decrement pulses are transmitted during a period in which there is no state transition (a period in which the state 1 continues and a period in which the state 3 continues). During the state 1, a decrement pulse is periodically transmitted. During the state 3, an incremental pulse is periodically transmitted. Thus, the reception side can periodically grasp the state of the transmission side.

Figure 9:
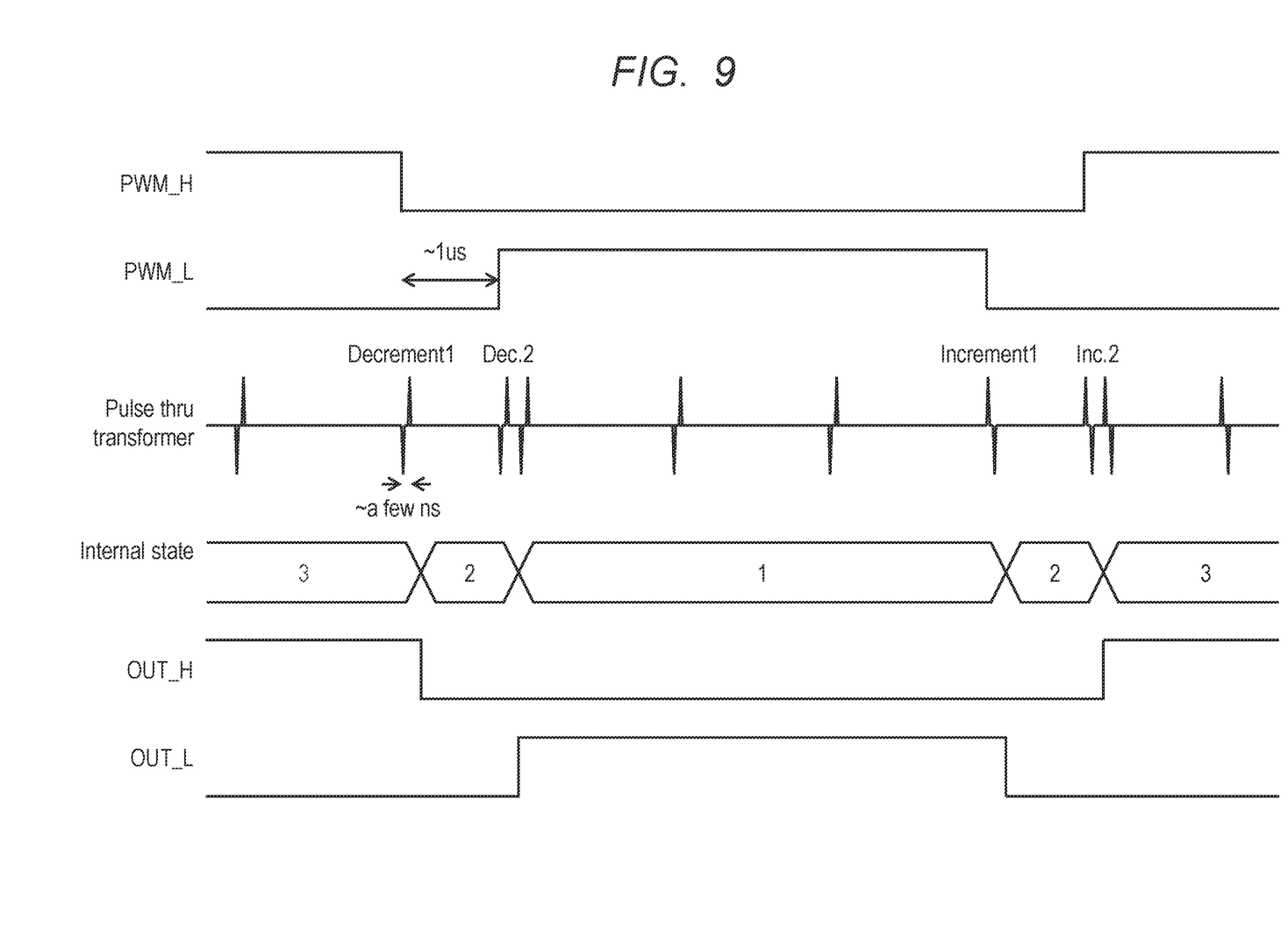
FIG. 9 is a flowchart for explaining an operation of the semiconductor device according to the third embodiment.

The periodically transmitted pulses may be pulses indicating the increment/decrement described in the second embodiment. FIG. 9 shows that an increment/decrement pulses of the second embodiment are transmitted during a period in which there is no state transition (a period in which State 1 continues and a period in which State 3 continues). On the receiving side, even if a pulse indicating a decrement is transmitted during a period in which the state 1 continues (after reception of a duplicated decrement pulse indicating a transition to the state 1), no further state transition from the state 1 is performed. Similarly, even if a pulse indicating an increment is transmitted during the period in which the state 3 continues (after the reception of the duplicated increment pulse indicating the transition to the state 3), no further state transition from the state 3 is performed. Therefore, the reception side can normally detect the state of the transmission side.

When a pulse is transmitted during the period of the state 2, a pulse indicating the increment or decrement in the second embodiment, that is, a pulse which is not duplicated, may be transmitted. On the receiving side, when a pulse that is not duplicated is received during the period of the state 2 (after receiving a decrement pulse from the state 3 or an increment pulse from the state 1), the state of the transmitting side can be detected by interpreting that the state 2 is maintained.

In the third embodiment, it is possible to make the same effect as in the second embodiment and suppress the mismatch between the states of the transmitting side and the receiving side.

Fourth Embodiment

Figure 10:
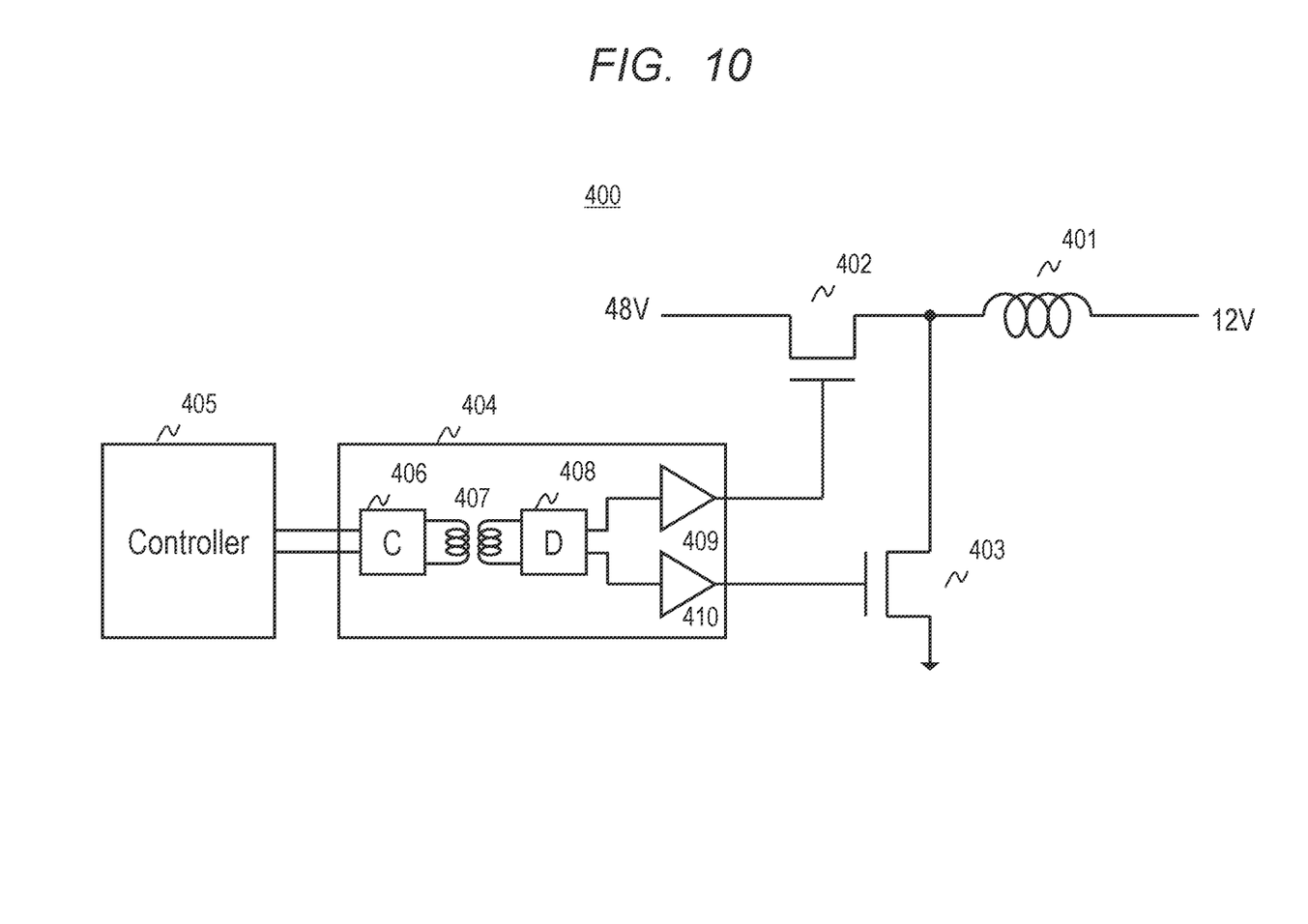
FIG. 10 is a block diagram of a control system according to a fourth embodiment.

FIG. 10 is a diagram in which the semiconductor device 100 according to the first embodiment is applied to a power supply circuit (a step-down converter, a step-up converter, or a step-up/down converter) 400 that is another control system. As shown in FIG. 10, the power supply circuit 400 includes a coil 401, a high-side switch (power transistor) 402, a low-side switch (power transistor) 403, a gate driver 404, and a controller 405.

The gate driver 404 has the same configuration as that of FIG. 1, and includes an encoding circuit 406, an isolator 407, a decoding circuit 408, and driver circuits 409 and 410. Note that in FIG. 10, the transmitting circuit and the receiving circuit of the semiconductor device 100 are omitted as being built in the encoding circuit 406 and the decoding circuit 408, respectively.

In the synchronous rectification type step-down or step-up converter, the high-side switch 402 and the low-side switch 403 are complementarily turned on/off, and are not turned on at the same time. Therefore, by using the encoding circuit 406 and the decoding circuit 408 which perform the same operation as in the first embodiment, it is possible to greatly reduce the area of the power supply circuit.

Note that not only the first embodiment but also the same semiconductor devices as in the second and third embodiments can be applied to the power supply circuit 400.

As described above, by applying the semiconductor devices of the first to third embodiments to the power supply circuit, it is possible to obtain the same effects in the power supply circuit as those of the first to third embodiments.

Fifth Embodiment

Figure 11:
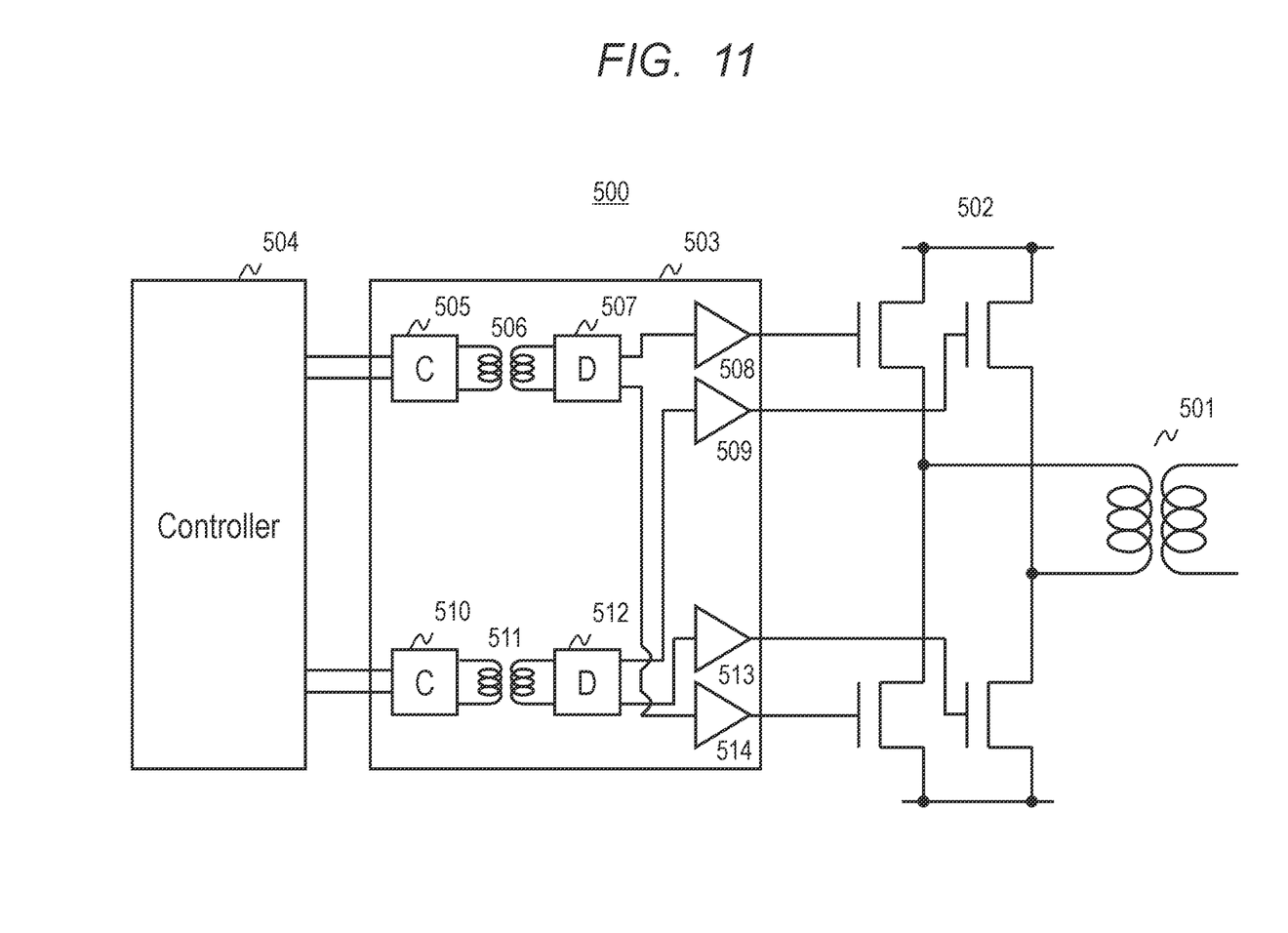
FIG. 11 is a block diagram of a control system according to a fifth embodiment.

FIG. 11 is a diagram in which the semiconductor device 100 according to the first embodiment is applied to an isolated-type converter 500 which is another control system. As shown in FIG. 11, the isolated converter 500 includes a transformer 501, a bridge circuit 502, a gate driver 503, and a controller 504.

The gate driver 503 has two sets of configurations in FIG. 1, namely, encoding circuits 505 and 510, isolators 506 and 511, decoding circuits 507 and 512, and driver circuits 508, 409, 513, and 514. Note that in FIG. 11, the transmitting circuit and the receiving circuit of the semiconductor device 100 are omitted as being built in the encoding circuits 505 and 510 and the decoding circuits 507 and 512, respectively.

The bridge circuit 502 may be a full bridge circuit or a half bridge circuit. In the case of a half-bridge circuit (one high-side switch and one low-side switch), the gate driver 503 has the same configuration as that of FIG. 1.

In the fifth embodiment, two sets of transmitting circuit, isolator, and receiving circuit, which were conventionally required by four sets, are required (in the case of a full-bridge circuit; in the case of a half-bridge circuit, one set of circuits, which were conventionally required by two sets).

In FIG. 11, the semiconductor device 100 is applied to the bridge circuit on the power transmission side (primary side), but may be used for gate driving of the synchronous rectification power transistor on the power reception side (secondary side).

In addition, not only the first embodiment but also the same semiconductor devices as those of the second and third embodiments can be applied to the isolated-type converter 500.

As described above, by applying the semiconductor devices of the first to third embodiments to the isolated-type converter, the same effects as those of the first to third embodiments can be obtained even in the isolated-type converter.

It should be noted that the present disclosure is not limited to the above-mentioned embodiments, and various modifications can be made without departing from the gist thereof. For example, when the encoding circuit detects a prohibited pattern for two input signals, the MCU may be notified of an error. Alternatively, when a prohibited pattern is detected, both the high-side switch and the low-side switch may be turned off. The following patterns are prohibited. (PWM_H, PWM_L)=(H, H). (PWM_H, PWM_L)=(H, L) or (L, H) continues for a certain period of time or longer. The certain period may be determined by the frequency of the PWM (e.g., the certain period is 200 us for the frequency 5 KHz of the PWM).

When the decoding circuit detects a specific abnormal state, an error may be notified to the MCU, or both the high-side switch and the low-side switch may be turned off. The abnormal state is as follows. The received signal does not change for a certain period of time (e.g., 200 us). The received signal has an undefined sign or signal pattern. The received signal indicates an undefined state transition. The undefined state transition is a case where a transition is made to the state 1 or the state 3 without passing through the state 2 (that is, a case where a dead time is not provided). Alternatively, in the second embodiment, the undefined state transition is a case where a decrement is received from the state 1, or an increment is received from the state 3.

What is claimed is:
1. A semiconductor device comprising:
 a galvanic isolator;
 a transmitting circuit that transmits a transmission signal via the galvanic isolator;
 a receiving circuit that receives a received signal corresponding to the transmission signal via the galvanic isolator;
 an encoding circuit that encodes two input signals and generates the transmission signal; and
 a decoding circuit that decodes the two input signals from the received signals,
 wherein the two input signals have a plurality of states according to combinations of values of the two input signals, wherein the encoding circuit generates the transmission signal based on state transitions of the plurality of states, wherein the decoding circuit decodes the two input signals based on state transitions of the plurality of states indicated by the received signal, wherein the plurality of states includes a first state, a second state and a third state, wherein the encoding circuit generates an increment signal and a decrement signal as the transmission signal based on the state transition from one of the first state to the third state to another state, wherein the increment signal indicates either a state transition from the first state to the second state or a state transition from the second state to the third state, and wherein the decrement signal indicates either a state transition from the third state to the second state or a state transition from the second state to the first state.

2. The semiconductor device according to claim 1, wherein the increment signal is a signal for causing the galvanic isolator to flow a current in a first direction, and wherein the decrement signal is a signal for causing the galvanic isolator to flow a current in a second direction.

3. The semiconductor device according to claim 2, wherein the encoding circuit duplicates the decrement signal when the two input signals transition to the first state, and duplicates the increment signal when the two input signals transition to the third state, and wherein the decoding circuit detects the state of the two input signals by the duplicated increment signal and the duplicated decrement signal.

4. The semiconductor device according to claim 3, wherein the encoding circuit generates the duplicated decrement signal when there is no state transition for a predetermined time after transition to the first state, and generates the duplicated increment signal when there is no state transition for a predetermined time after transition to the third state.

5. The semiconductor device according to claim 3, wherein the encoding circuit generates the decrement signal when there is no state transition for a predetermined time after transition to the first state, and generates the increment signal when there is no state transition for a predetermined time after transition to the third state.

6. The semiconductor device according to claim 3, wherein the encoding circuit generates one of the increment signal and the decrement signal when there is no state transition for a predetermined time after the transition to the second state, and wherein the decoding circuit, after the transition to the second state, determines that the two input signals maintain the second state when receiving either the increment signal and the decrement signal.

7. A semiconductor device comprising:
a galvanic isolator;
a transmitting circuit that transmits a transmission signal via the galvanic isolator;
a receiving circuit that receives a received signal corresponding to the transmission signal via the galvanic isolator;
an encoding circuit that encodes two input signals and generates the transmission signal; and
a decoding circuit that decodes the two input signals from the received signals, wherein the two input signals are PWM signals for PWM (Pulse Width Modulation) controlled high-side switch and PWM controlled low-side switch.

8. A semiconductor device comprising:
a galvanic isolator;
a transmitting circuit that transmits a transmission signal via the galvanic isolator;
a receiving circuit that receives a received signal corresponding to the transmission signal via the galvanic isolator;
an encoding circuit that encodes two input signals and generates the transmission signal; and
a decoding circuit that decodes the two input signals from the received signals, wherein when the encoding circuit detects a state prohibited for the two input signals, the encoding circuit performs a predetermined process.

9. A semiconductor device comprising:
a galvanic isolator;
a transmitting circuit that transmits a transmission signal via the galvanic isolator;
a receiving circuit that receives a received signal corresponding to the transmission signal via the galvanic isolator;
an encoding circuit that encodes two input signals and generates the transmission signal; and
a decoding circuit that decodes the two input signals from the received signals, wherein when the decoding circuit detects an abnormal state in the received signal, the decoding circuit performs a predetermined process.

10. A control system, comprising:
a high-side switch and a low-side switch that drive a load;
a controller that outputs a first PWM signal for controlling the high-side switch and a second PWM signal for controlling the low-side switch; and
a gate driver that drives the high-side switch and the low-side switch based on the first PWM signal and the second PWM signal, wherein the gate driver includes:
a galvanic isolator;
a transmitting circuit that transmits a transmission signal via the galvanic isolator;
a receiving circuit that receives a received signal corresponding to the transmission signal via the galvanic isolator;
an encoding circuit that encodes the first PWM signal and the second PWM signal to generate the transmission signal;
a decoding circuit that decodes the first PWM signal and the second PWM signal from the received signal;
a first driver circuit that drives the high-side switch based on the decoded first PWM signal; and
a second driver circuit that drives the low-side switch based on the decoded second PWM signal.

11. The control system according to claim 10, wherein the first PWM signal and the second PWM signal have a plurality of states according to combinations of values of the first and second PWM signals, wherein the encoding circuit generates the transmission signal based on the plurality of states, and wherein the decoding circuit decodes the first PWM signal and the second PWM signal based on the plurality of states indicated by the received signal.

12. The control system according to claim 10,
wherein the first PWM signal and the second PWM signal have a plurality of states according to combinations of values of the first and second PWM signals,
wherein the encoding circuit generates the transmission signal based on state transitions of the plurality of states, and
wherein the decoding circuit decodes the first PWM signal and the second PWM signal based on state transitions of the plurality of states indicated by the received signal.

13. The control system according to claim 12,
wherein the plurality of states includes a first state, a second state and a third state,
wherein the encoding circuit generates an increment signal and a decrement signal as the transmission signal based on the state transition from one of the first state to the third state to another state,
wherein the increment signal indicates either a state transition from the first state to the second state or a state transition from the second state to the third state, and
wherein the decrement signal indicates either a state transition from the third state to the second state or a state transition from the second state to the first state.

14. The control system according to claim 13,
wherein the increment signal is a signal for causing the galvanic isolator to flow a current in a first direction, and
wherein the decrement signal is a signal for causing the galvanic isolator to flow a current in a second direction.

* * * * *